US009378992B2

(12) United States Patent
Huseinovic et al.

(10) Patent No.: US 9,378,992 B2
(45) Date of Patent: Jun. 28, 2016

(54) HIGH THROUGHPUT HEATED ION IMPLANTATION SYSTEM AND METHOD

(71) Applicant: Axcelis Technologies, Inc., Beverly, MA (US)

(72) Inventors: Armin Huseinovic, Winchester, MA (US); Joseph Ferrara, Georgetown, MA (US); Brian Terry, Amesbury, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 147 days.

(21) Appl. No.: 14/317,778

(22) Filed: Jun. 27, 2014

(65) Prior Publication Data
US 2015/0380285 A1 Dec. 31, 2015

(51) Int. Cl.
*H01J 37/18* (2006.01)
*H01J 37/20* (2006.01)
*H01L 21/67* (2006.01)
*H01L 21/265* (2006.01)
(Continued)

(52) U.S. Cl.
CPC ......... *H01L 21/67201* (2013.01); *H01J 37/185* (2013.01); *H01J 37/20* (2013.01); *H01J 37/3171* (2013.01); *H01L 21/265* (2013.01); *H01L 21/67103* (2013.01); *H01L 21/67109* (2013.01); *H01L 21/67115* (2013.01); *H01L 21/67161* (2013.01); *H01L 21/67213* (2013.01); *H01L 21/67712* (2013.01)

(58) Field of Classification Search
CPC ..... H01J 37/3171; H01J 37/18; H01J 37/185; H01J 37/3002; H01L 21/02002; H01L 21/26593

USPC ................. 250/492.21, 492.2, 442.11, 491.1, 250/492.3, 398, 440.11, 289, 423 R, 4, 25, 250/443.1, 453.11; 118/724
See application file for complete search history.

(56) References Cited

U.S. PATENT DOCUMENTS 4,733,091 A * 3/1988 Robinson .......... H01L 21/68707
118/730
4,949,783 A * 8/1990 Lakios .............. H01L 21/67109
118/69

(Continued)

OTHER PUBLICATIONS

Office Action Dated Jun. 18, 2010 U.S. Appl. No. 11/634,644.
(Continued)

*Primary Examiner* — David A Vanore
(74) *Attorney, Agent, or Firm* — Eschweiler & Associates, LLC

(57) ABSTRACT

An ion implantation system has an ion implantation apparatus coupled to first and second dual load lock assemblies, each having a respective first and second chamber separated by a common wall. Each first chamber has a pre-heat apparatus configured to heat a workpiece to a first temperature. Each second chamber has a post-cool apparatus configured to cool the workpiece to a second temperature. A thermal chuck retains the workpiece in a process chamber for ion implantation, and the thermal chuck is configured to heat the workpiece to a third temperature. A pump and vent are in selective fluid communication with the first and second chambers. A controller is configured to heat the workpiece to the first temperature in an atmospheric environment via the pre-heat apparatus, to heat the workpiece to the second temperature via the thermal chuck, to implant ions into the workpiece via the ion implantation apparatus, and to transfer the workpiece between atmospheric and vacuum environments via a control of the pre-heat apparatus, post-cool apparatus, pump, vent, and thermal chuck.

29 Claims, 10 Drawing Sheets

(51) Int. Cl.
*H01L 21/677* (2006.01)
*H01J 37/317* (2006.01)

(56) References Cited

U.S. PATENT DOCUMENTS

| | | | |
|---|---|---|---|
| 5,134,301 A * | 7/1992 | Kamata | H01J 27/26 250/492.2 |
| 5,314,541 A * | 5/1994 | Saito | C23C 14/566 118/50 |
| 5,357,115 A | 10/1994 | Asakawa et al. | |
| 5,484,011 A * | 1/1996 | Tepman | C23C 14/50 165/80.2 |
| 5,565,034 A | 10/1996 | Nanbu et al. | |
| 5,751,003 A * | 5/1998 | Rose | H01J 27/14 250/442.11 |
| 5,878,943 A * | 3/1999 | Nishikawa | B23K 1/0016 228/180.22 |
| 5,980,195 A | 11/1999 | Miyashita | |
| 5,989,346 A | 11/1999 | Hiroki | |
| 6,719,517 B2 | 4/2004 | Beaulieu et al. | |
| 6,740,894 B1 * | 5/2004 | Mitchell | H01J 37/20 250/398 |
| 6,855,916 B1 | 2/2005 | Matthews et al. | |
| 6,896,513 B2 | 5/2005 | Bachrach et al. | |
| 6,900,444 B2 * | 5/2005 | Ferrara | H01J 37/20 250/281 |
| 7,010,388 B2 | 3/2006 | Mitchell et al. | |
| 7,019,263 B2 | 3/2006 | Ishihara | |
| 8,089,055 B2 * | 1/2012 | Brailove | H01L 21/67201 250/491.1 |
| 8,193,513 B2 * | 6/2012 | DiVergilio | H01J 37/08 250/423 R |
| 8,227,768 B2 * | 7/2012 | Smick | F16M 11/04 250/491.1 |
| 8,319,196 B2 | 11/2012 | England et al. | |
| 8,450,193 B2 | 5/2013 | England et al. | |
| 8,616,820 B2 | 12/2013 | Kurita et al. | |
| 8,668,816 B2 * | 3/2014 | Ding | C23C 14/358 204/298.06 |
| 9,117,628 B2 * | 8/2015 | Kirkpatrick | H01L 37/244 37/244 |
| 2002/0005168 A1 | 1/2002 | Kraus et al. | |
| 2002/0014407 A1 | 2/2002 | Allen et al. | |
| 2003/0057130 A1 | 3/2003 | Fix et al. | |
| 2003/0091410 A1 | 5/2003 | Larson et al. | |
| 2003/0113187 A1 | 6/2003 | Lei et al. | |
| 2003/0123958 A1 | 7/2003 | Sieradzki et al. | |
| 2004/0191028 A1 | 9/2004 | Tamai | |
| 2004/0234359 A1 | 11/2004 | Mitchell et al. | |
| 2005/0063799 A1 | 3/2005 | Larson et al. | |
| 2005/0232727 A1 | 10/2005 | Ferrara | |
| 2005/0274459 A1 | 12/2005 | Tanase et al. | |
| 2006/0021702 A1 | 2/2006 | Kumar et al. | |
| 2006/0219952 A1 * | 10/2006 | Mehta | H01J 37/32412 250/492.21 |
| 2007/0189880 A1 | 8/2007 | Bufano et al. | |
| 2007/0264106 A1 | 11/2007 | Van Der Meulen | |
| 2008/0138175 A1 | 6/2008 | Mitchell et al. | |
| 2008/0138178 A1 | 6/2008 | Ferrara et al. | |
| 2008/0199612 A1 * | 8/2008 | Keevers | H01L 21/3003 427/255.11 |
| 2008/0217812 A1 | 9/2008 | Perrone | |
| 2008/0225261 A1 * | 9/2008 | Hirayanagi | G03F 7/70691 355/72 |
| 2009/0200494 A1 * | 8/2009 | Hatem | H01J 37/3171 250/492.21 |
| 2011/0291030 A1 * | 12/2011 | Lee | H01J 37/185 250/492.21 |
| 2013/0112334 A1 * | 5/2013 | Tsuno | H01L 21/67092 156/64 |
| 2013/0320208 A1 * | 12/2013 | Lee | H01J 37/185 250/289 |
| 2014/0034846 A1 * | 2/2014 | Lee | H01J 37/18 250/453.11 |
| 2014/0065730 A1 * | 3/2014 | Reece | H01L 22/26 438/5 |
| 2014/0361197 A1 * | 12/2014 | Lee | H01J 37/20 250/492.21 |
| 2015/0228515 A1 * | 8/2015 | Lee | H01L 21/6831 165/61 |

OTHER PUBLICATIONS

Final Office Action Dated Nov. 16, 2010 U.S. Appl. No. 11/634,644.
Office Action Dated May 9, 2013 U.S. Appl. No. 11/634,644.
Final Office Action Dated Nov. 1, 2013 U.S. Appl. No. 11/634,644.
Office Action Dated Jun. 15, 2010 U.S. Appl. No. 11/634,697.
Final Office Action Dated Nov. 16, 2010 U.S. Appl. No. 11/634,697.
Notice of Allowance Dated Feb. 17, 2011 U.S. Appl. No. 11/634,697.
U.S. Appl. No. 11/634,697 filed on Dec. 6, 2006.
U.S. Appl. No. 11/634,644 filed on Dec. 6, 2006.

* cited by examiner

HIGH THROUGHPUT HEATED ION IMPLANTATION SYSTEM AND METHOD

FIELD OF THE INVENTION

The present invention relates generally to workpiece processing systems and methods for processing workpieces, and more specifically to a system and method for heated ion implantation of workpieces wherein throughput is maximized.

BACKGROUND OF THE INVENTION

In semiconductor processing, many operations may be performed on a single workpiece or semiconductor wafer. In general, each processing operation on a workpiece is typically performed in a particular order, wherein each operation waits until completion of a preceding operation, thus affecting the time at which the workpiece will become available for a subsequent processing step. Tool productivity or throughput for relatively short processes performed under vacuum, such as ion implantation, can be severely limited if the process flow leading to the processing location is interrupted by sequential events associated with such processing. For example, operations such as an exchange of workpieces between transport carriers or storage cassettes and the processing system, a transfer of the workpiece from an atmospheric environment into an evacuated environment of an implantation chamber of the processing system, and an orientation of the workpiece (e.g., notch alignment) within the evacuated environment, can have a significant impact on tool productivity.

Processing of a workpiece, such as ion implantation, for example, is typically performed at a reduced pressure within an implantation chamber, wherein ions are generally accelerated along a beam line, and wherein the ions enter the evacuated implantation chamber and strike the workpiece in a predetermined manner (e.g., a predetermined dose, energy, etc.). Several operations are typically performed leading up to the implantation in order to introduce the workpiece into the implantation chamber, as well as to properly position and orient the workpiece with respect to the ion beam within the ion implantation chamber. For example, the workpiece is transferred via a robot from an atmospheric cassette or storage device into a load lock chamber, wherein the load lock chamber is subsequently evacuated in order to bring the workpiece into the vacuum processing environment of the ion implanter. The cassette or storage device, for example, may be delivered to the ion implanter via a conveyor system or other type of delivery apparatus.

As ion implantation processing technology advances, hot ion implantation processes are becoming more common, where a workpiece is heated and implanted with ions at process temperatures ranging from 300° C.-600° C. This process temperature is typically achieved via an electrostatic chuck (ESC) that holds the workpiece during implantation. Such heating via the electrostatic chuck in the vacuum environment of the ion implantation chamber can be time consuming and cause a significant impact to workpiece throughput. Further, when a relatively cold workpiece at room temperature is clamped and heated by an electrostatic chuck to such high process temperatures, thermal expansion of the workpiece can cause deleterious movement of the workpiece with respect to the ESC, causing particles and premature wear of the clamping surface and/or electrodes of the ESC.

SUMMARY OF THE INVENTION

The present invention overcomes the limitations of the prior art by providing a system, apparatus, and method for transferring workpieces between atmospheric and vacuum environments of high temperature ion implantation systems, while maximizing throughput and minimizing costs of ownership associated with the systems.

Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an ion implantation system having an ion implantation apparatus. The ion implantation apparatus is configured to direct an ion beam toward a process chamber, wherein the process chamber has a vacuum environment associated therewith. A first dual load lock assembly and a second dual load lock assembly are provided, wherein each of the first dual load lock assembly and second dual load lock assembly respectively comprises a first chamber and a second chamber.

Respective internal volumes of each first and second chamber are generally isolated from one another by a common wall, wherein each of the first chamber and second chamber has a respective vacuum door and an atmospheric door. Each respective vacuum door is configured to provide selective fluid communication between the respective first chamber and second chamber and the vacuum environment. Each respective atmospheric door is configured to provide selective fluid communication between the respective first chamber and second chamber and an atmospheric environment.

According to one exemplary aspect, each first chamber has a pre-heat apparatus associated therewith, wherein the pre-heat apparatus is configured to heat a workpiece disposed within the first chamber to a first temperature. According to another aspect, each second chamber has a post-cool apparatus configured to cool the workpiece to a second temperature when the workpiece is disposed within the respective second chamber. The common wall between the first and second chambers of each of the first and second dual load lock assemblies separates the first and second chambers and also generally defines a thermal barrier between the respective first and second chambers. The thermal barrier, for example, comprises a plate having a first cooling channel passing therethrough, wherein a first cooling fluid passing through the first cooling channel substantially thermally isolates the first and second chambers from one another. According to one example, the plate generally defines a cold plate configured to support the workpiece within the second chamber, and wherein the first cooling fluid passing through the first cooling channel substantially cools the workpiece to the second temperature.

A thermal chuck, for example, is further configured to selectively retain the workpiece thereon within the process chamber. The thermal chuck is further configured to heat the workpiece to a third temperature that is greater than the first temperature, and wherein the thermal chuck retains the workpiece thereon concurrent with the ion beam impinging on the workpiece. The thermal chuck, for example, comprises a heated electrostatic chuck.

A pump is further provided in selective fluid communication with the first and second chambers of the respective first and second dual load lock assemblies, and a vent is further provided in selective fluid communication with the first and second chambers of the respective first and second dual load lock assemblies.

According to another exemplary aspect, a controller is provided and configured to heat the workpiece to the first temperature in the atmospheric environment via the pre-heat apparatus, and to then heat the workpiece to the third temperature via the thermal chuck for heated ion implantation. The controller can be configured to implant ions into the workpiece via the ion implantation apparatus, and to cool the workpiece to the second temperature via the post-cool apparatus. The controller is further configured to selectively transfer the workpiece between the atmospheric environment and the vacuum environment via a control of the pump, vent, and the respective atmospheric doors and vacuum doors of the respective first dual load lock assembly and second dual load lock assembly.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
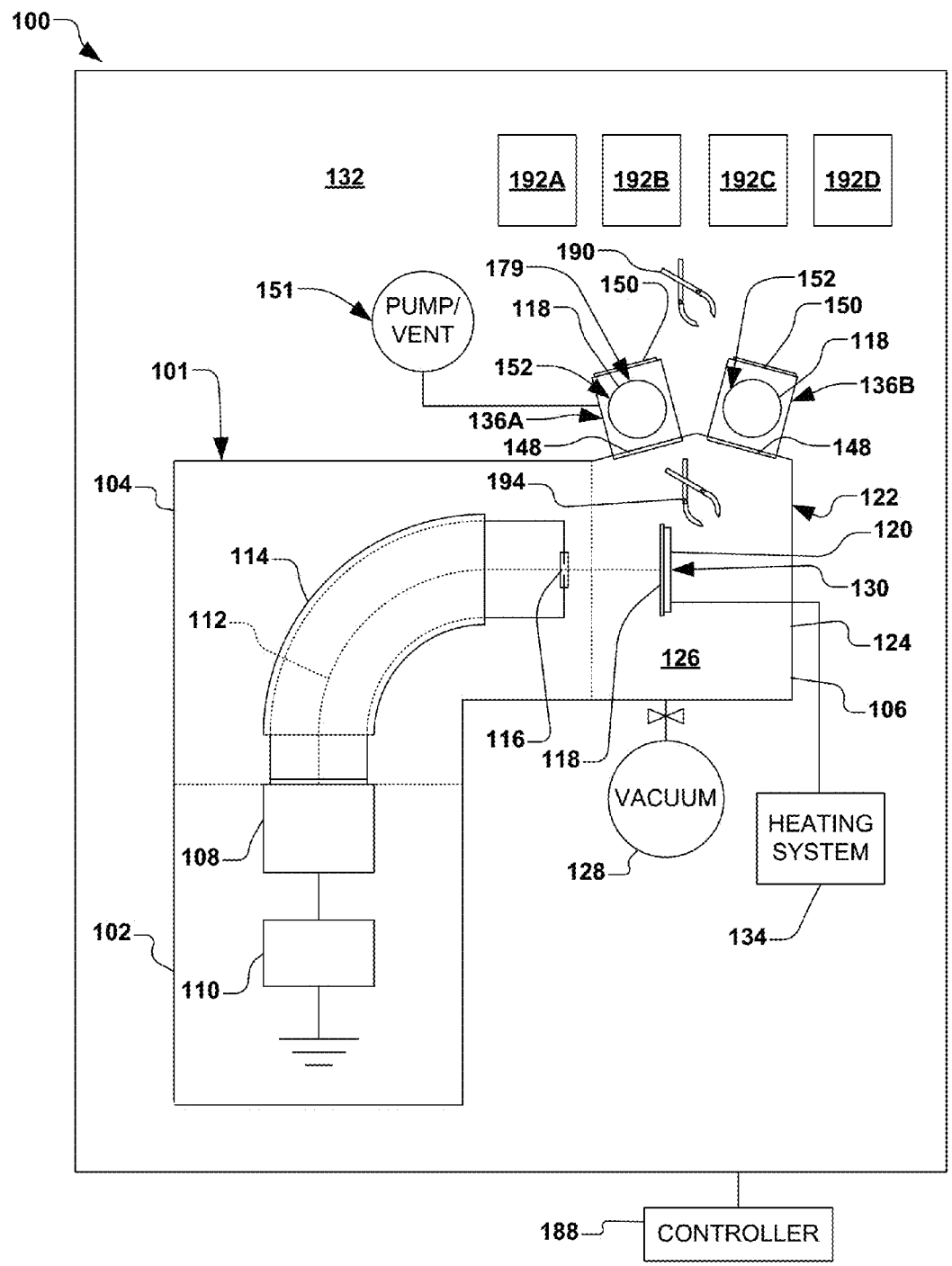
FIG. 1 illustrates a block diagram of an exemplary heated ion implantation system in accordance with one aspect of the present disclosure.

The present invention is directed generally toward ion implantation systems, and more particularly, to a heated ion implantation system having a high workpiece throughput capacity. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

In accordance with one aspect of the present disclosure, FIG. 1 illustrates an exemplary ion implantation system 100. The ion implantation system 100 in the present example comprises an exemplary ion implantation apparatus 101, however various other types of vacuum-based semiconductor processing systems are also contemplated, such as plasma processing systems, or other semiconductor processing systems. The ion implantation apparatus 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed through a mass analysis apparatus 114, and out an aperture 116 towards the end station 106. In the end station 106, the ion beam 112 bombards a workpiece 118 (e.g., a substrate such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

In one example, the ion implantation apparatus 101 is configured to provide a high temperature ion implantation, wherein the workpiece 118 is heated to a process temperature (e.g., approximately 600° C.). Thus, in the present example, the chuck 120 comprises a thermal chuck 130, wherein the thermal chuck is configured to support and retain the workpiece 118 while further heating the workpiece 118 within the process chamber 122 prior to, during, and/or after the exposure of the workpiece to the ion beam 112.

The thermal chuck 130, for example, comprises an electrostatic chuck (ESC) configured to heat the workpiece 118 to a processing temperature that is considerably greater than an ambient or atmospheric temperature of the surroundings or external environment 132 (e.g., also called an "atmospheric environment"). A heating system 134 may be further provided, wherein the heating system is configured to heat the thermal chuck 130 and, in turn, the workpiece 118 residing thereon to the desired processing temperature.

The inventors appreciate that heating of the workpiece 118 to such high process temperatures can deleteriously affect cycle time through the ion implantation system 100, wherein conventionally, the workpiece is allowed to "soak" on the chuck 120 within the vacuum of the process environment 126 until the desired temperature is reached. In order to increase process throughput, the present disclosure thus provides a first dual load lock assembly 136A and a second dual load lock assembly 136B operatively coupled to the process chamber 122.

Figure 2:
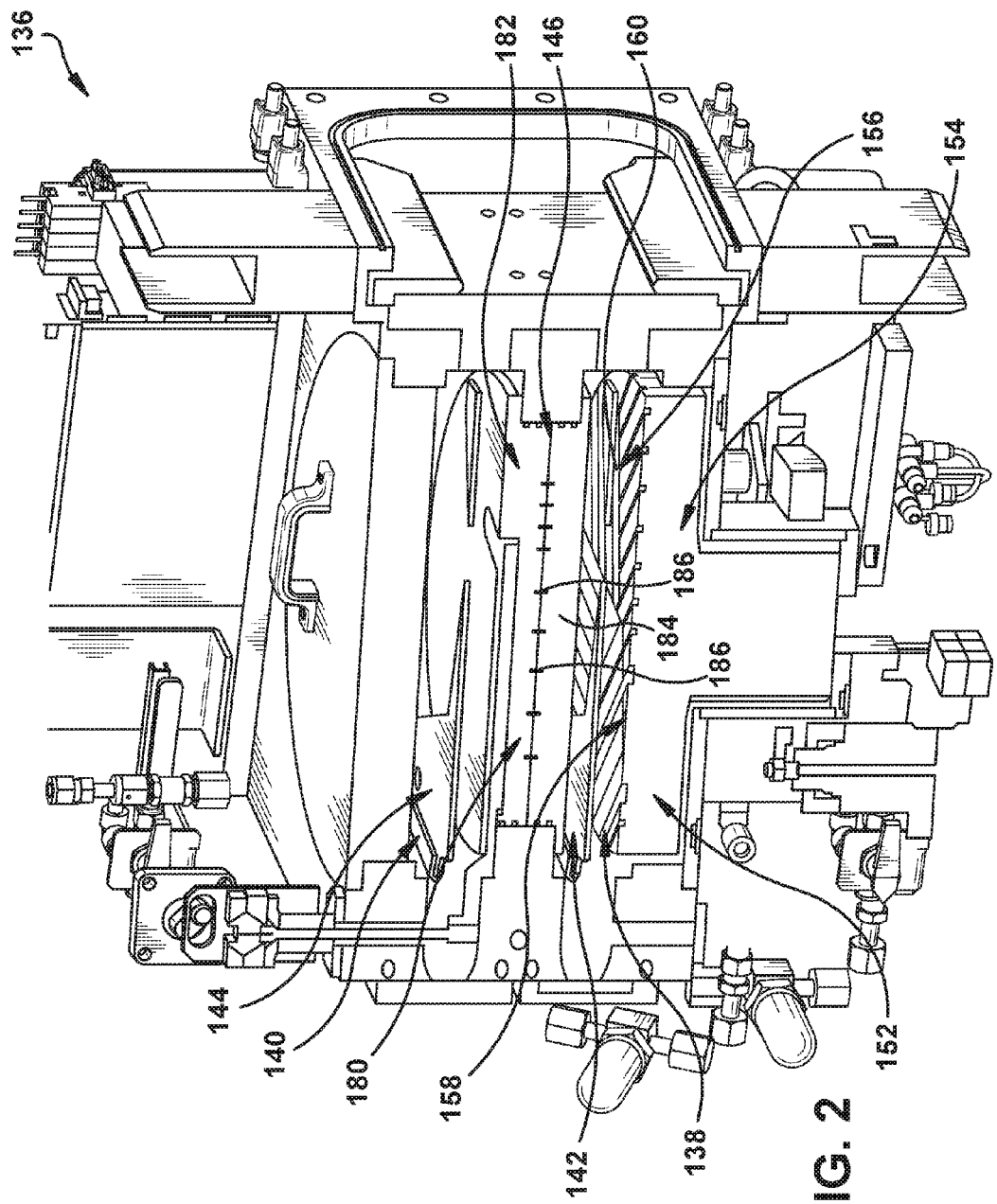
FIG. 2 Illustrates a perspective view of an exemplary dual load lock assembly according to another aspect of the disclosure.

FIG. 2 illustrates an exemplary dual load lock assembly 136 in greater detail in accordance with several aspects of the disclosure. It should be noted that the dual load lock assembly 136 and components thereof illustrated in FIGS. 2-7 can be considered to be representative of both of the first dual load lock assembly 136A and the second dual load lock assembly 136B of FIG. 1, wherein similar features can be present in both the first dual load lock assembly second dual load lock assembly.

Figure 3:
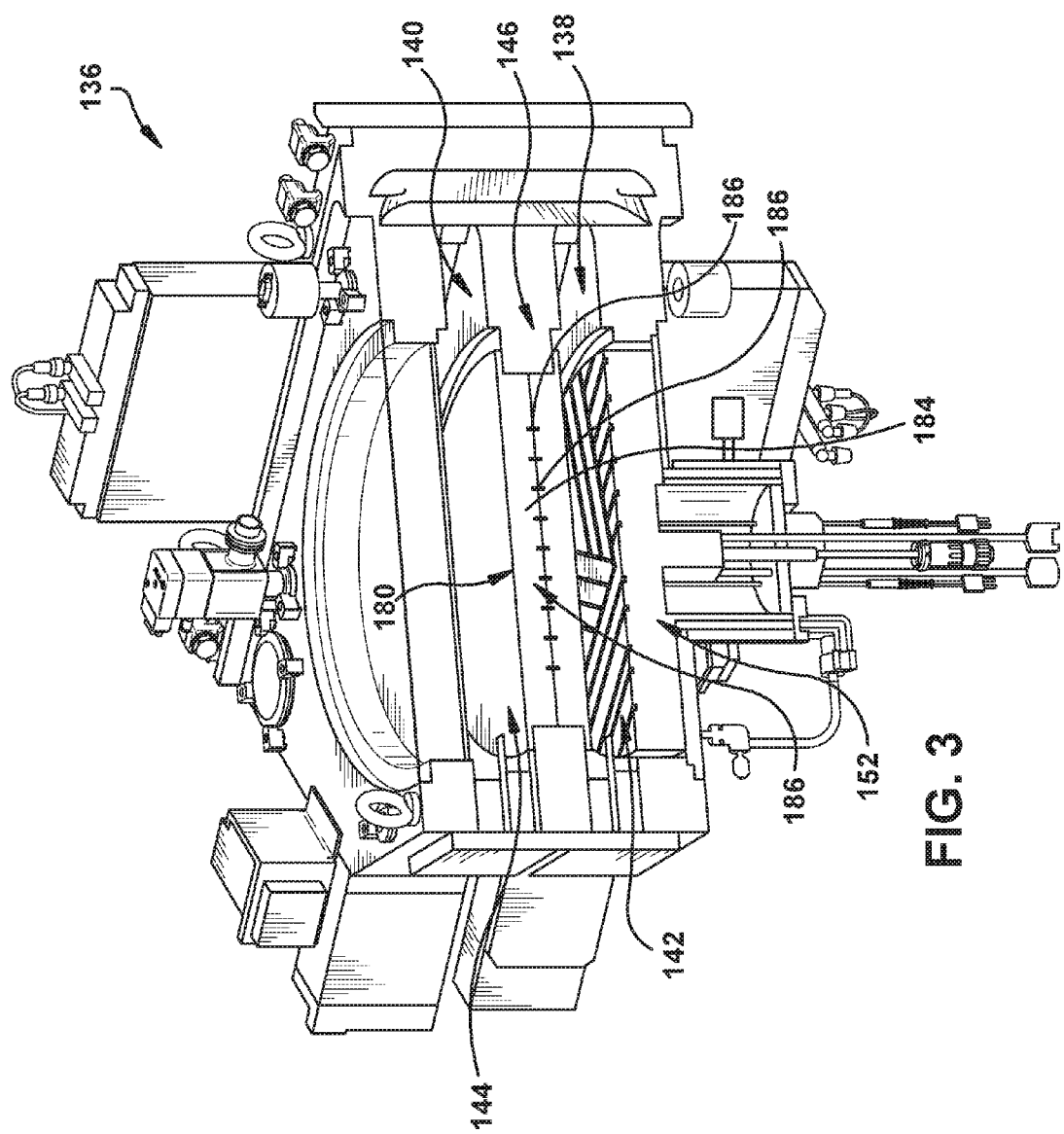
FIG. 3 illustrates another perspective view of an exemplary dual load lock assembly according to another aspect of the disclosure.
Figure 4:
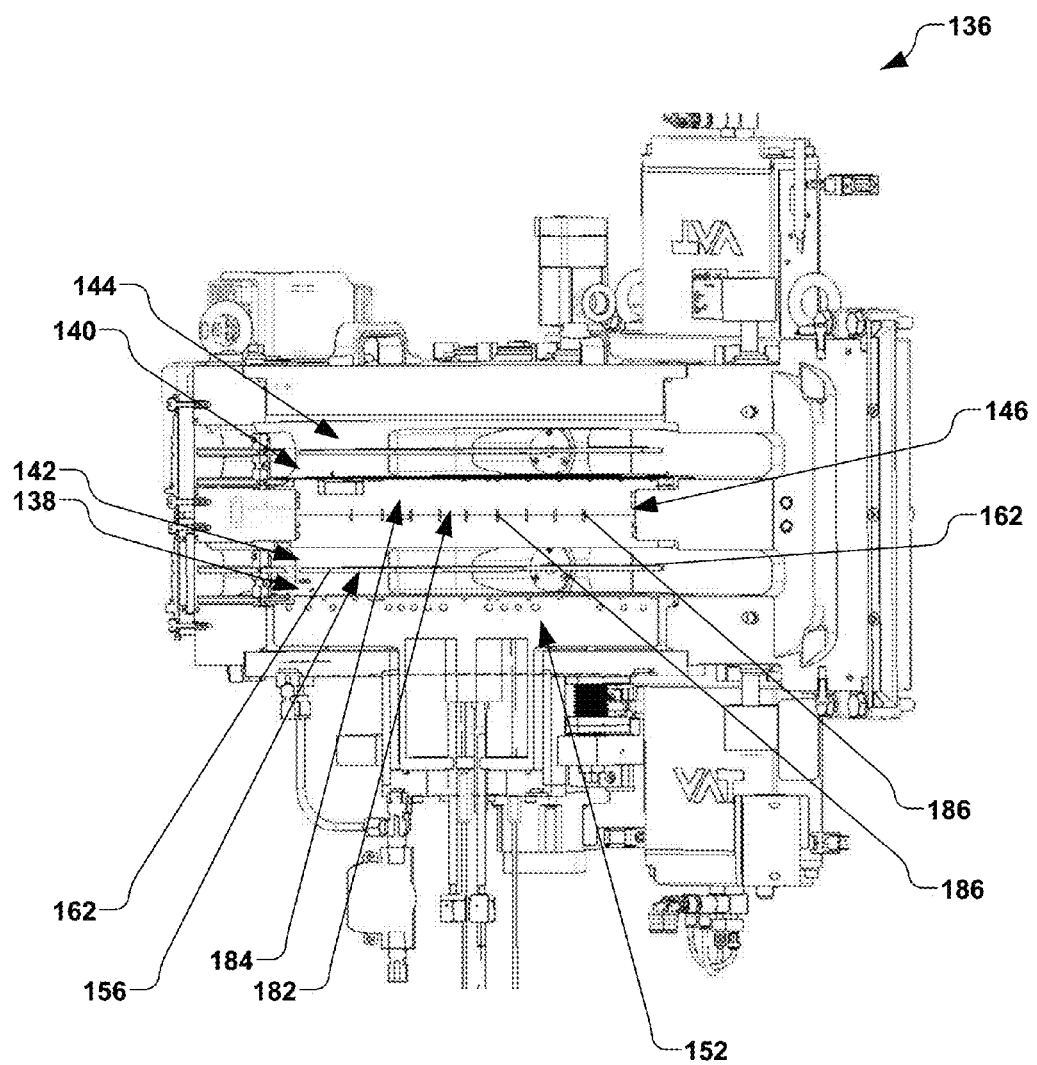
FIG. 4 illustrates a partial cross-sectional view of an exemplary dual load lock assembly according to another aspect of the disclosure.
Figure 5:
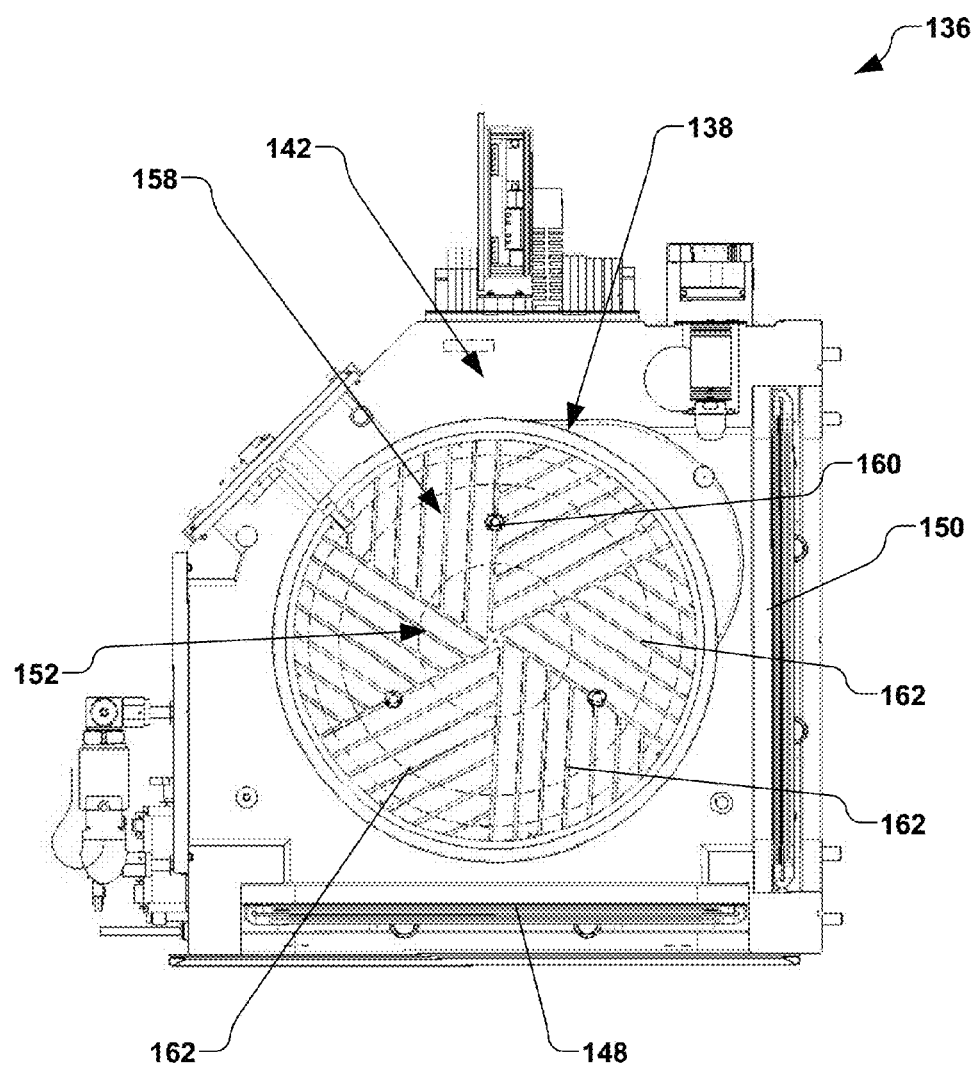
FIG. 5 illustrates a plan view of a first chamber of an exemplary dual load lock assembly according to another aspect of the disclosure.
Figure 6:
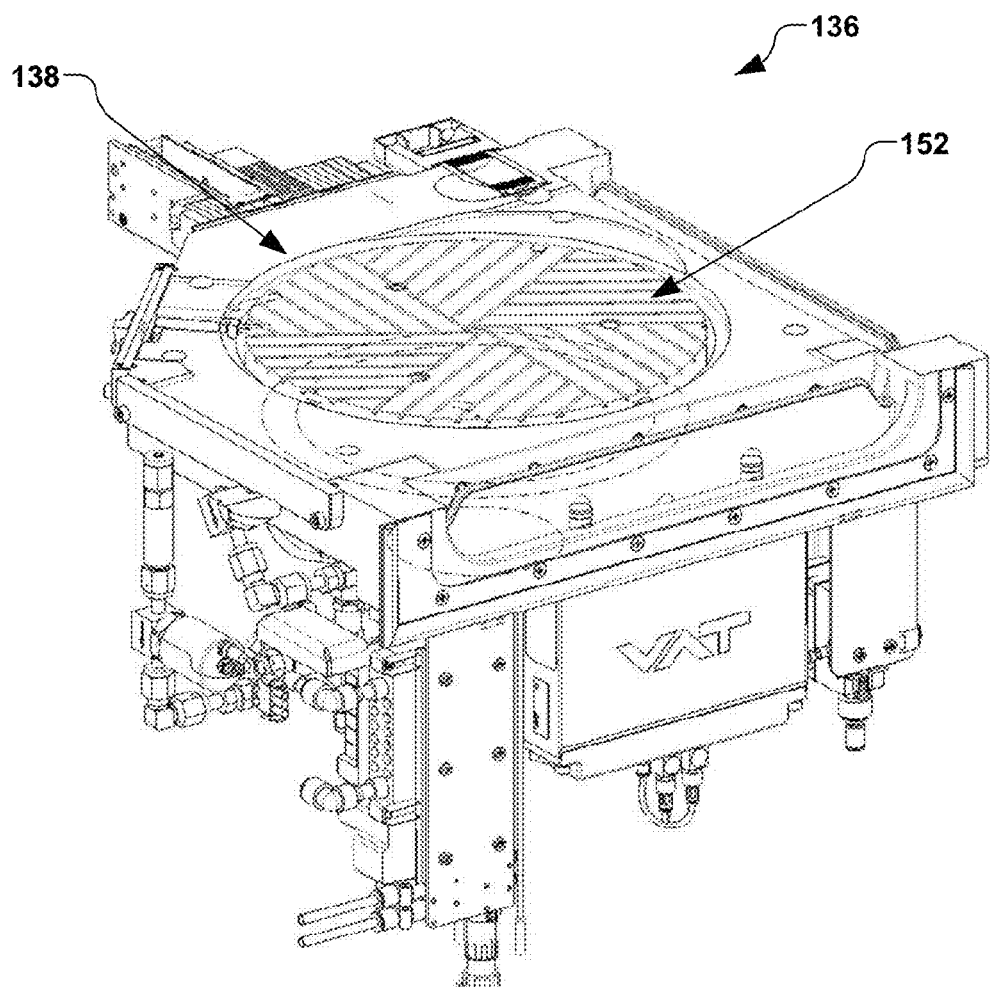
FIG. 6 illustrates a perspective view of a first chamber of an exemplary dual load lock assembly according to another aspect of the disclosure.
Figure 7:
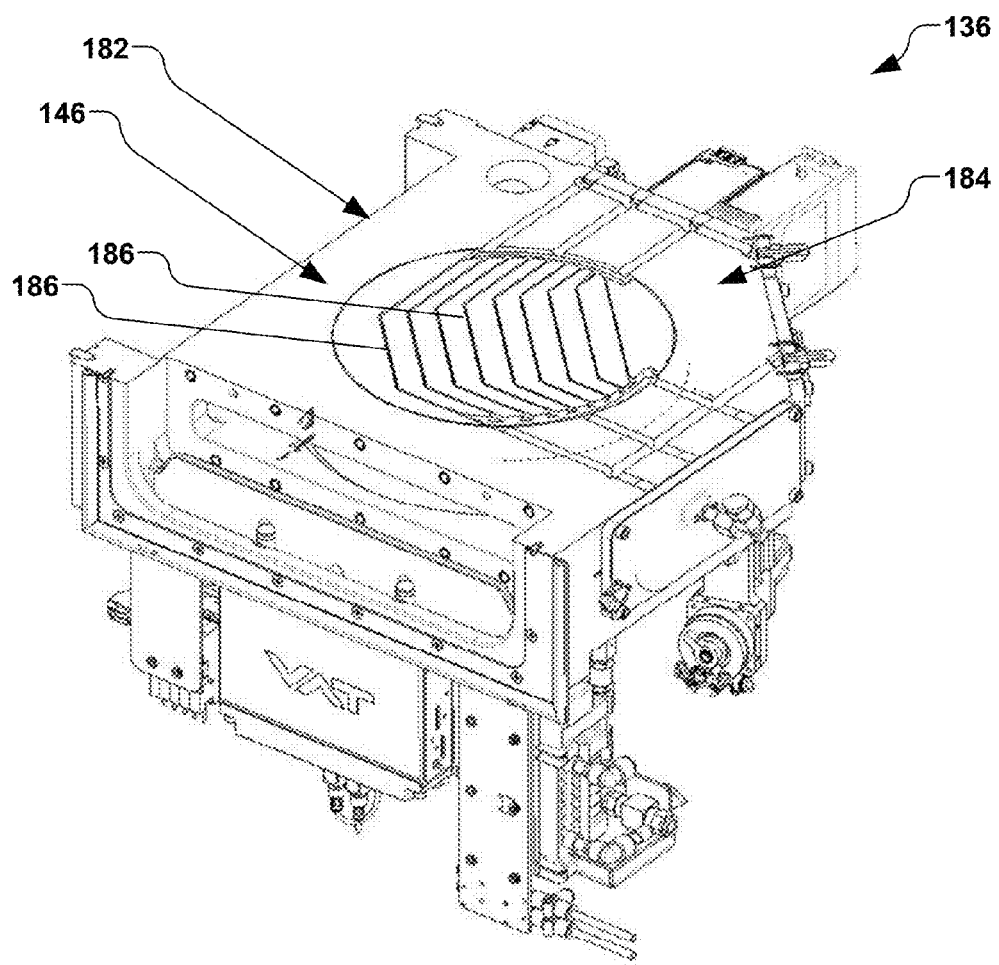
FIG. 7 illustrates a perspective view of a common wall of an exemplary dual load lock assembly according to another aspect of the disclosure.

As illustrated in FIGS. 2-4, for example, the dual load lock assembly 136 comprises a vertically stacked configuration, wherein first chamber 138 and a second chamber 140 are substantially aligned one above the other, and wherein respective internal volumes 142 and 144 associated with each of the first and second chambers are generally isolated from one another via a common wall 146 that is shared between the first and second chambers. Each of the first chamber 138 and second chamber 140 has a respective vacuum door 148 and atmospheric door 150 (e.g., one of each vacuum door and atmospheric door is illustrated in FIGS. 1 and 5). Each respective vacuum door 148 is configured to provide selective fluid communication between the respective first chamber 136 or second chamber 138 and the vacuum environment 126. Further, each respective atmospheric door 150 is configured to provide selective fluid communication between the respective first chamber 138 or second chamber 140 and the atmospheric environment 132.

It is noted that in the present example, each of the first chamber 138 and second chamber 140 is provided with a separate vacuum door 148 and atmospheric door 150, thereby providing a total of two vacuum doors and two atmospheric doors per dual load lock assembly 136. However, it is also contemplated that the dual load lock assembly 136 can be serviced by just one vacuum door 148 and one atmospheric door 150, servicing both of the first and second chambers 138 and 140. Still further, a vacuum pump and vent 151 illustrated in FIG. 1 can be further provided in selective fluid communication with the first and second chambers 138 and 140 of each dual load lock assembly 136 illustrated in FIG. 2. The vacuum pump and vent 151 of FIG. 1 selectively provides a vacuum to the interiors of the respective first and second chambers 138 and 140 of FIG. 2 or vents the interiors of the respective first and second chambers to atmosphere.

In accordance with one exemplary aspect of the present disclosure, the first chamber 138 comprises a pre-heat apparatus 152, as illustrated in FIGS. 2-6. The pre-heat apparatus 152, for example, is configured to heat a workpiece (not shown) disposed within the first chamber 138 to a first temperature, which could be on the order of approximately 300° C.-700° C. The first temperature, for example, may be equal to, lower, or higher than the process temperature, which in one example, can generally range between approximately 400° C. to 600° C. A first temperature that is lower than the process temperature can improve throughput, while allowing further heat losses during subsequent transport of the workpiece 118 to the process chamber 122. A first temperature that is higher than the process temperature may limit otherwise-required heating on the thermal chuck 130, but rather, the thermal chuck can simply maintain the workpiece as the desired temperature. As such, heat losses can be minimized during transfer of the workpiece 118 between the first chamber 138 and the thermal chuck 130.

Depending on the workflow based on the tool architecture, process, and desired throughput, the workpiece 118 may be preheated to the first temperature via the pre-heat apparatus 152, wherein the first temperature is equal to or lower than the process temperature, thus allowing for a final thermal equalization on the thermal chuck 130 inside the vacuum chamber 124 of FIG. 1. Such a scenario allows the workpiece 118 to lose some heat during transfer to the process chamber 122, wherein final heating to the process temperature is performed on the thermal chuck 130. Alternatively, the workpiece 118 may be preheated via the pre-heat apparatus 152 to a first temperature that is higher than the process temperature. Accordingly, the first temperature would be optimized so that cooling of the workpiece 118 during transfer to the process chamber 122 is just enough for the workpiece to be at the process temperature as it is clamped onto the thermal chuck 130.

Accordingly, the pre-heat apparatus 152 associated with the first chamber 138 of the dual load lock assembly 136 can advantageously heat the workpiece 118 at the atmospheric pressure of the external environment 132 prior to bringing the workpiece to the vacuum of the process environment 126 of the process chamber 120. For example, heat transfer into the workpiece 118 in a high vacuum environment, such as within the process chamber 120, is largely dominated by radiation. Total hemispherical emissivity of crystalline silicon in temperatures between 300° C. and 500° C., for example, ranges between approximately 0.2 and 0.6, thus not lending itself well to fast wafer thermal transients due to a low rate of irradiated heat absorption of the workpiece 118.

In order to accelerate the thermal ramp-up and enable an additional mechanism for heat transfer, the back side of the workpiece 118 is brought into conductive communication with the thermal chuck 130. This conductive communication is achieved through a pressure controlled gas interface (also called "back side gas") between the thermal chuck 130 and the workpiece 118. Pressure of the back side gas, for example, is generally limited by the electrostatic force of the thermal chuck 130, and can be generally kept in the range of 5-20 Torr. The back side gas interface thickness (e.g., the distance between the workpiece 118 and the thermal chuck 130) is controlled in the order of microns (typically 5-20 µm), and as such, the molecular mean free path in this pressure regime becomes large enough for the interface thickness to push the system into the transitional and molecular gas regime.

Systems used herein, for example, can have a Knudsen number in the range between Kn=1 and Kn=5. The transitional to molecular gas flow regime, for example, is described by a Knudsen number greater than unity ($Kn=\lambda/d>1$, where $\lambda$ is the average gas mean free path and d is the system characteristic length—which in this case is the interface layer thickness. While in the viscous gas regime ($Kn\ll 1$), thermal conductivity is not a substantial function of gas pressure and density. In transitional to molecular flow regime, a rarified gas condition, with $Kn>1$, gas thermal conductivity becomes a strong function of gas pressure and the system characteristic length.

Increasing the pressure within this interface layer, for example, by way of increasing thermal conductivity, can substantially decrease thermal resistance for heat transfer between the workpiece 118 and the thermal chuck 130. Lower thermal resistance then allows for a relatively lower thermal gradient between the thermal chuck 130 and the workpiece 118, as well as for an accelerated thermal ramp for the workpiece to reach its steady state temperature. Faster thermal equalization of the workpiece 118 helps achieve better overall system workpiece throughput.

Accordingly, the present disclosure appreciates benefits to providing a high pressure environment for workpiece pre-heating, as well, so as to have a viscous flow regime in the interface layer between the workpiece 118 and the heat source, which in this case, is the pre-heat apparatus 152. Thus, maximum thermal conductivity of the gas interface layer between the workpiece 118 and the pre-heat apparatus 152 is achieved at the atmospheric pressure of the atmospheric environment 132 and heat transfer performance is maximized.

Alternatively, the pre-heat apparatus 152 can heat the workpiece 118 at the vacuum pressure of the process environment 126. In yet another alternative, the pre-heat apparatus 152 can heat the workpiece 118 during the same timeframe that the first chamber 138 is being pumped down to transition from atmospheric pressure to vacuum pressure.

The pre-heat apparatus 152, for example, comprises a hot plate 154 positioned within the first chamber 138, as illustrated in FIG. 2. The hot plate 154, for example, comprises a resistive heater, which could include a heating element embedded in the hot plate, a heat pump, or other heating mechanism for transmitting heat energy form the hot plate to the workpiece 118. According to one example, a lifting mechanism 156 is further provided and configured to selectively translate the workpiece (not shown) to and from a surface 158 of the pre-heat apparatus 152. The lifting mechanism 156, for example, comprises a plurality of lift pins 160 (also shown in FIG. 5) selectively extending through the surface 158 of the hot plate 154. Alternatively, as illustrated in FIG. 4, the lifting mechanism 156 comprises one or more supports 162 configured to selectively engage and lift a periphery of the workpiece (not shown).

In accordance with another aspect, the pre-heat apparatus 152 shown in FIG. 5, for example, illustrates gas evacuation channels 162 defined in the surface 158 of the hot plate 154, wherein a gas (not shown) is provided within the interface layer between the workpiece 118 and the hot plate. For example, the gas is allowed to evacuate during pump-down of the first chamber 138 through the gas evacuation channels 162 without displacing the workpiece 118 that may be otherwise caused by lift forces from pressure differentials across the workpiece.

According to another example, the pre-heat apparatus 152 of FIG. 1 comprises a radiant heat source 179. For example, the radiant heat source 179 comprises one or more a halogen lamp, light emitting diode, and infra red thermal device. In one example, the first chamber 138 comprises a window (not shown), wherein the radiant heat source is disposed outside of the first chamber and wherein the radiant heat source is configured to direct radiant energy through a window toward the workpiece disposed within the first chamber.

Figure 8:
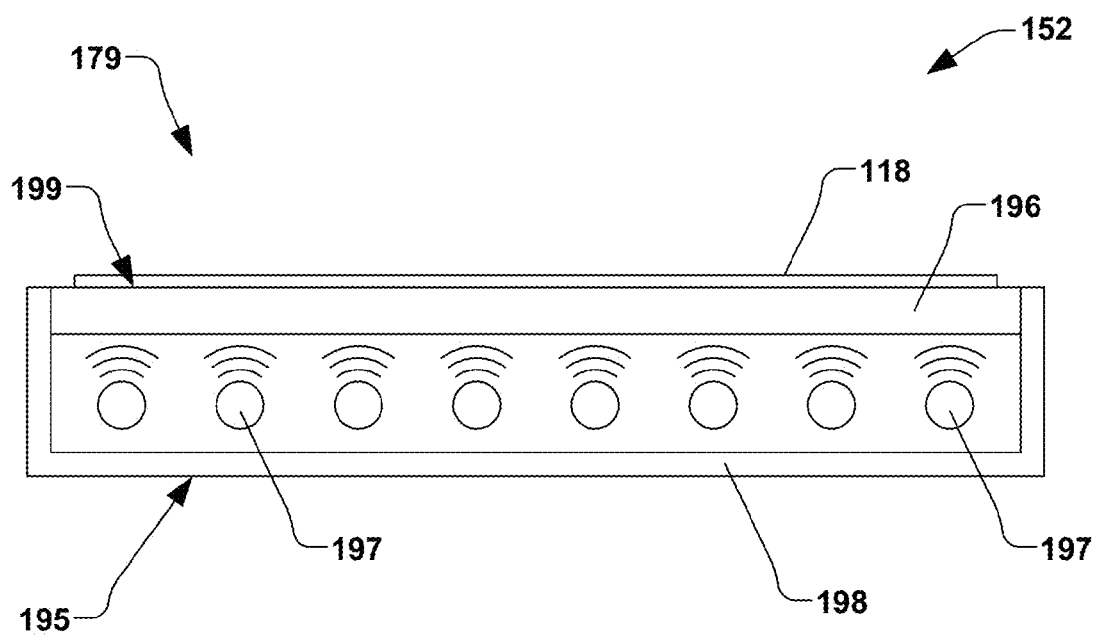
FIG. 8 illustrates an exemplary radiant heat source in accordance with another aspect of the disclosure.

In accordance with another example, the radiant heat source 179 of FIG. 1 comprises a generally hollow pan 195 having a ceramic lid 196, as illustrated in FIG. 8. For example, an alloy-based heating element 197 (e.g., Ni—Cr, Inconel, etc.) is provided within the generally hollow pan 195, wherein the heating element is configured to selectively provide radiant energy to the ceramic lid 196. A radiation shield 198 (e.g., molybdenum, nickel, etc.) having low emissivity is further provided. The ceramic lid 196, for example, is generally flat and comprised of silicon carbide or other suitable material. Thus, the ceramic lid 196 is configured to selectively heat the workpiece 118 when the workpiece resides on a surface 199 of the ceramic lid.

In accordance with another aspect of the disclosure, the second chamber 140 of the dual load lock assembly 136 comprises a post-cool apparatus 180 configured to cool the workpiece to a second temperature when the workpiece is disposed within the second chamber subsequent to being implanted with ions during ion implantation. The second temperature, for example, is substantially lower than the first temperature and/or process temperature.

For example, the common wall 146 illustrated in FIG. 2 provides both a physical and a thermal barrier 182 positioned between the first chamber 138 and second chamber 140 of the dual load lock assembly 136. The common wall 146, for example, further isolates the first chamber 138 form the second chamber 140 and can provide cooling to the exterior surfaces of the dual load lock assembly 136 while also providing cooling to the second chamber 140. The common wall 146, for example, can also provide cooling of the first chamber 138. The thermal barrier 182, for example, comprises a plate 184 having a cooling channel 186 passing therethrough. A cooling fluid (e.g., water) passing through the cooling channel 186 substantially thermally isolates the first chamber 138 from the second chamber 140. The plate 184, for example, can further generally define a cold plate 186 configured to support the workpiece within the second chamber 140, wherein the cooling fluid passing through the cooling channel further substantially cools the workpiece to the second temperature.

Alternatively, the post-cool apparatus 180 comprises a chilled workpiece support (not shown) that is separate from the thermal barrier 182, wherein the chilled workpiece support is configured to actively cool a workpiece residing thereon via thermal conduction. The chilled workpiece support, for example, comprises a cold plate having a second cooling channel passing therethrough, wherein a second cooling fluid passing through the second cooling channel substantially cools the workpiece residing on a surface of the cold plate.

As illustrated in FIG. 1, a controller 188 is further provided and configured to activate each respective pre-heat apparatus 152 to transmit heat energy to the respective workpiece 118 at the atmospheric pressure, therein raising a temperature of the respective workpiece to a first predetermined temperature. The controller 188, for example, is further configured to activate each respective post-cool apparatus 180 to cool the respective workpiece 118 to a second predetermined temperature. The controller 188 can be further configured to heat the workpiece 118 to the first temperature in the first chamber 138 via the pre-heat apparatus 152, to heat the workpiece to the processing temperature in the processing chamber 122 via the thermal chuck 130, to implant ions into the workpiece via the ion implantation apparatus 101, to cool the workpiece to the second temperature in the second chamber 140 via the post-cool apparatus 180, and to selectively transfer the workpiece between the atmospheric environment 132 and the vacuum environment 126 via control of the pump and vent 151, and the respective atmospheric doors 150 and vacuum doors 148 of the respective first and second dual load lock assemblies 136A, 136B.

Figure 9:
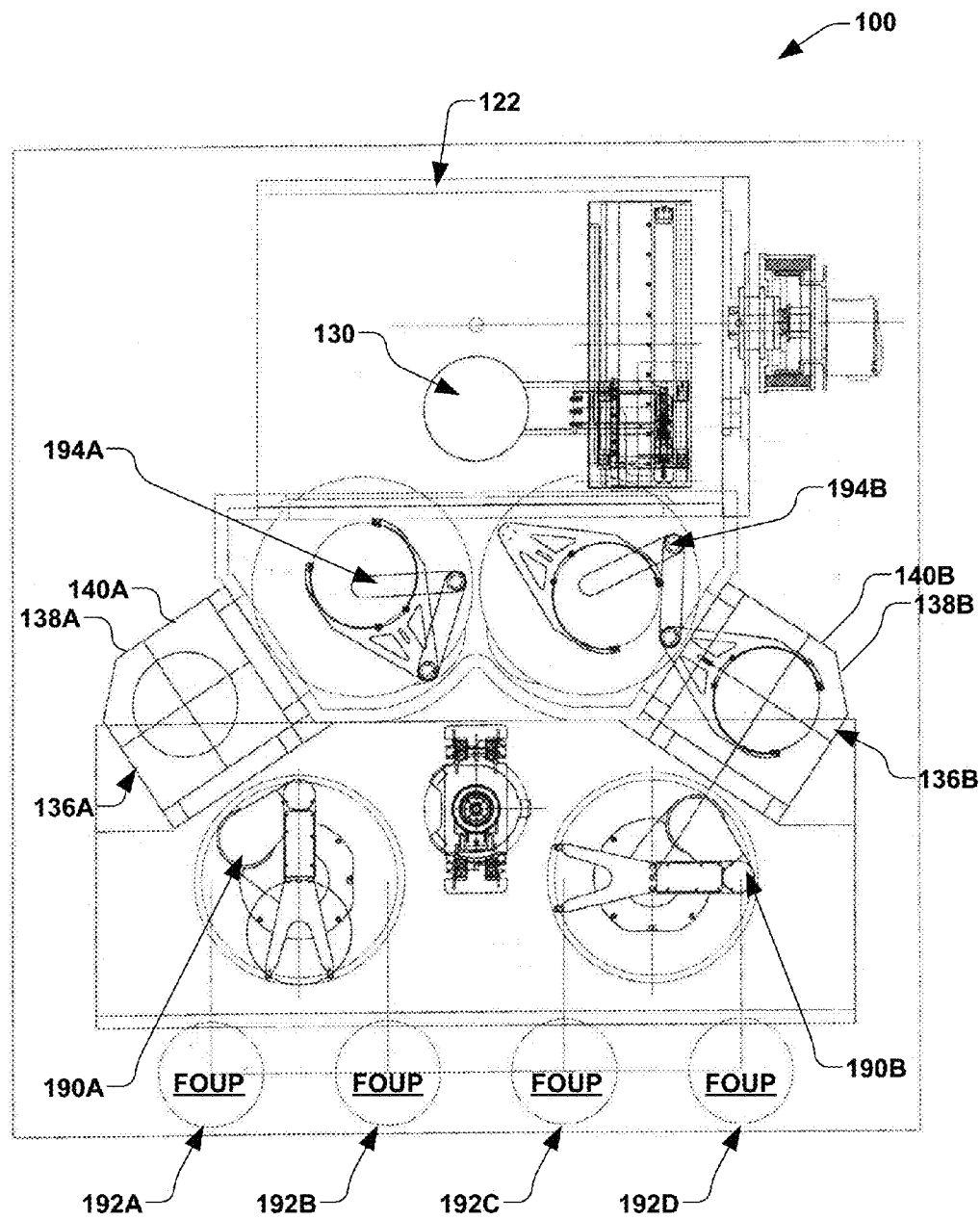
FIG. 9 illustrates another exemplary heated ion implantation system according to another aspect of the disclosure.

FIG. 9 illustrates the exemplary heated ion implantation system 100 of FIG. 1 in greater detail in accordance with the present invention, wherein it will be appreciated that the architecture of the ion implantation system illustrated in FIGS. 1 and 9, combined with the vertically stacked dual load lock assemblies 136A, 136B described in detail herein, enables multiple process flows that can be advantageously modified to enable a maximized high throughput of workpieces through the system. It should be noted that flow of workpieces 118 in the following example can be reversed, as will be appreciated by one of ordinary skill. For example, in a first embodiment, a workpiece 118 (e.g., typically in the form of a wafer) can be delivered to and from the process chamber 122 such that the workpiece is first transported by a first "in-air" robot 190A from a selected front opening unified pod (FOUP) 192A, 192B to the first chamber 138A of a selected dual load lock assembly 136A.

The workpiece 118 is heated at atmospheric pressure within the first chamber 138, and the first chamber is then evacuated to bring the internal environment thereof to vacuum pressure. This heating and pressurization can occur sequentially, simultaneously, or concurrently. However, the present disclosure appreciates that heating the workpiece 118 in atmospheric pressure provides various advantages, such as substantially fast thermal ramp-up speeds that can be achieved at higher atmospheric pressures compared to lower vacuum pressures. Further, it is noted that since the workpiece 118 is not fixedly maintained within the first chamber 138 (e.g., not clamped or restrained other than by gravitational force), the workpiece is free to expand during heating, thus minimizing chances for cracking, breakage, or particle creation due to thermal expansion of the workpiece.

For example, when a relatively cold workpiece 118 is brought into the first chamber 138, it undergoes a substantial temperature increase. In doing so, added energy into the workpiece 118 drives material volumetric expansion of the workpiece. If the workpiece 118 was externally constrained (e.g., by a clamping force of a chuck), the expansion of the workpiece could cause internal stresses within the workpiece due to these external constraints. As a result, back side particles and scratches on the workpiece 118 can be generated due to friction. Ultimately, such an over-constraining clamping force, in combination with thermal gradients and thermal shock in the workpiece, can lead to breakage of the workpiece. It is therefore desirable to have an unconstrained system in which to advantageously provide thermal equalization of the workpiece without external forces. The system 100 of FIG. 1 does not require positive force clamping to retain the workpiece 118 on the pre-heat apparatus 152, as the entire thermal preheat cycle can be performed in atmospheric pressure, wherein the only external forces acting on the workpiece are gravity and friction. Thus, the workpiece 118 is relatively free to achieve its volumetric thermal expansion without the above-mentioned over-constraining external forces.

In accordance with the present example, once the workpiece 118 is pre-heated via the pre-heat apparatus 152, the workpiece is then transported from the first chamber 138A to the process chamber 122 for ion implantation by a first vacuum robot 194A associated with the selected dual load lock assembly (in the present example, the first dual load lock assembly 136A). After the high temperature ion implantation process is complete, the workpiece 118 can be transported via a second vacuum robot 194B associated with the dual load lock assembly (e.g., in the present example, the second dual load lock assembly 136B) to the second chamber 140B thereof. At this point, the workpiece 118 is then cooled and the second chamber 140 is vented to bring the internal environment thereof back to atmospheric pressure. The workpiece 118 is then transported back to a FOUP 192C, 192D via a second "in-air" robot 190B.

Alternatively, in a second embodiment, a workpiece 118 can be delivered to and from the process chamber 122 by transporting the workpiece from a selected FOUP 192 to the first chamber 138A of a selected dual load lock assembly 136 (in the present example, dual load lock assembly 136A), where the workpiece is heated and the first chamber is subsequently evacuated to bring the internal environment thereof to vacuum pressure for subsequent delivery to the process chamber 122 by a first vacuum robot 194A associated with the selected dual load lock assembly. Thereafter, the workpiece 118 can be transported via the same vacuum robot 194A associated with the same dual load lock assembly 136A to the second chamber 140A thereof so that the workpiece can be cooled and the second chamber vented to allow the workpiece to be transported back to the FOUP 192A, 192B via the first "in-air" robot 190A. It will be understood that various alternative workflow paths can be enabled in an effort to facilitate multiple processing steps, in parallel, among the FOUPS 192, robots 190, 194, dual load lock assemblies 136, the first and second load lock chambers 138, 140 thereof, and the process chamber 122.

Figure 10:
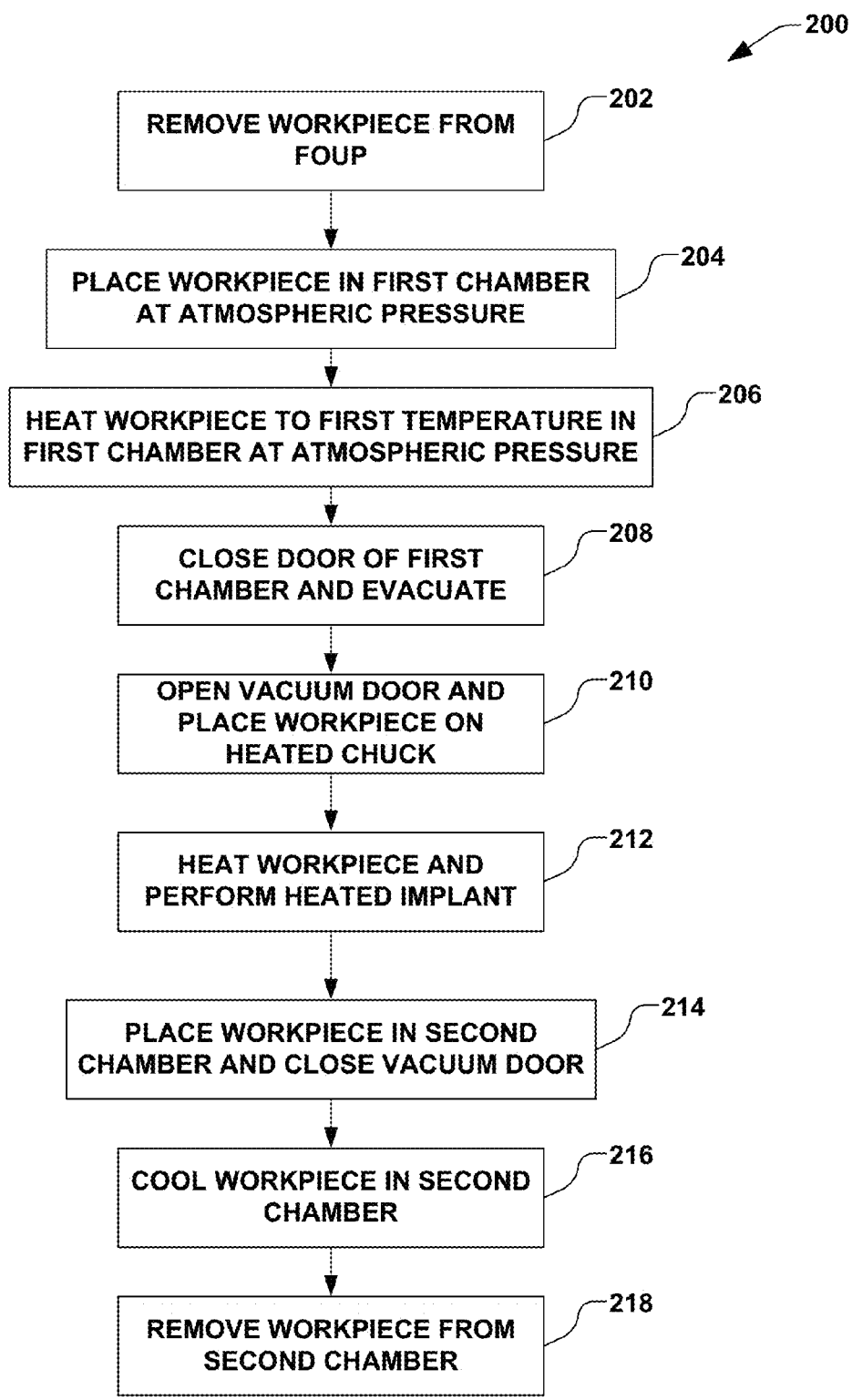
FIG. 10 is a block diagram illustrating an exemplary method for heated ion implantation of workpieces according to another exemplary aspect of the invention.

FIG. 10 illustrates an exemplary method 200 for improving throughput in a heated ion implantation process in accordance with the present invention. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 10, the method 200 begins at act 202, wherein a workpiece is removed from a FOUP. The workpiece is placed in a first chamber of a dual load lock assembly in atmospheric conditions in act 204. In act 206, the workpiece is heated at atmospheric pressure in the first chamber to a first temperature. In act 208, an atmospheric door of the first chamber is closed and the first chamber is generally evacuated. Depending on the timing of act 208, the heating of act 206 can be carried out, either entirely or partially, at atmospheric pressure, during transition from atmospheric pressure to vacuum pressure, or at vacuum pressure. In act 210, a vacuum door of the first chamber is opened, and the workpiece is removed from the first chamber and placed on a heated chuck. In act 212, the workpiece is heated via the heated chuck to a process temperature, and the heated workpiece is implanted with ions via a heated ion implant.

In act 214, once the heated ion implantation is complete, the workpiece is placed in a second chamber of a dual load lock assembly and a vacuum door of the second chamber is closed. In act 216, the workpiece is cooled to a second temperature on a cooling plate that shares a wall with the first chamber. In act 218, an atmospheric door of the second chamber is opened, and the workpiece is removed from the second chamber. Once again, depending on the timing of act 218, the cooling of act 216 can be carried out, either entirely or partially, at vacuum pressure, during transition from vacuum pressure to atmospheric pressure, or at atmospheric pressure.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system, comprising:
   an ion implantation apparatus configured to direct an ion beam toward a process chamber, wherein the process chamber has a vacuum environment associated therewith at a vacuum pressure;
   a first dual load lock assembly and a second dual load lock assembly, wherein each of the first dual load lock assembly and second dual load lock assembly respectively comprises a first chamber and a second chamber, wherein respective internal volumes of each first and second chamber are generally isolated from one another and share a common wall therebetween, and wherein each of the first chamber and second chamber has a respective vacuum door and atmospheric door, wherein each respective vacuum door is configured to provide selective fluid communication between the respective first chamber or second chamber and the vacuum environment, and wherein each respective atmospheric door is configured to provide selective fluid communication between the respective first chamber or second chamber and an atmospheric environment having an atmospheric pressure associated therewith, and wherein each first chamber has a pre-heat apparatus associated therewith, wherein the pre-heat apparatus is configured to heat a workpiece disposed within the respective first chamber, and wherein each second chamber has a post-cool apparatus associated therewith, wherein the post-cool apparatus is configured to cool the workpiece disposed within the respective second chamber; and
   a controller configured to activate each respective pre-heat apparatus to transmit heat energy to the respective workpiece at the atmospheric pressure, therein raising a temperature of the respective workpiece to a first predetermined temperature, and wherein the controller is further configured to activate each respective post-cool apparatus to cool the respective workpiece to a second predetermined temperature.

2. The ion implantation system of claim 1, wherein the controller is further configured to activate the respective pre-heat apparatus to transmit heat energy to the respective workpiece at the vacuum pressure.

3. The ion implantation system of claim 1, further comprising:
   a thermal chuck configured to selectively retain the workpiece thereon within the process chamber, wherein the thermal chuck is further configured to heat the workpiece to a processing temperature that is greater than the first temperature, and wherein the thermal chuck retains the workpiece thereon concurrent with the ion beam impinging on the workpiece.

4. The ion implantation system of claim 3, further comprising:
   a pump in selective fluid communication with the first and second chambers of the respective first and second dual load lock assemblies;
   a vent in selective fluid communication with the first and second chambers of the respective first and second dual load lock assemblies.

5. The ion implantation system of claim 4, wherein the controller is further configured to heat the workpiece to the first temperature in the first chamber via the pre-heat apparatus, to heat the workpiece to the processing temperature in the processing chamber via the thermal chuck, to implant ions into the workpiece via the ion implantation apparatus, to cool the workpiece to the second temperature in the second chamber via the post-cool apparatus, and to selectively transfer the workpiece between the atmospheric environment and the vacuum environment via control of the pump, vent, and the respective atmospheric doors and vacuum doors of the respective first dual load lock assembly and second dual load lock assembly.

6. The ion implantation system of claim 1, wherein the pre-heat apparatus comprises a hot plate positioned within the first chamber of one or more of the first dual load lock assembly and second dual load lock assembly.

7. The ion implantation system of claim 1, further comprising a thermal barrier positioned between the first and second chambers of the respective first dual load lock assembly and second dual load lock assembly, wherein the thermal barrier, wherein the thermal barrier generally defines the common wall between the first and second chambers.

8. The ion implantation system of claim 7, wherein the thermal barrier comprises a plate having a first cooling channel passing therethrough, wherein a first cooling fluid passing through the first cooling channel substantially thermally isolates the first and second chambers from one another.

9. The ion implantation system of claim 8, wherein the plate generally defines a cold plate configured to support the workpiece within the second chamber, and wherein the first cooling fluid passing through the first cooling channel substantially cools the workpiece to the second temperature.

10. The ion implantation system of claim 1, wherein each of the first dual load lock assembly and second dual load lock assembly further comprise a lifting mechanism configured to selectively translate the workpiece with respect to the pre-heat apparatus.

11. The ion implantation system of claim 10, wherein the pre-heat apparatus comprises a hot plate positioned within the first chamber of one or more of the first dual load lock assembly and second dual load lock assembly, and wherein the lifting mechanism is configured to selectively translate the workpiece to and from a surface of the pre-heat apparatus.

12. The ion implantation system of claim 11, wherein the lifting mechanism comprises a plurality of lift pins selectively extending through the surface of the hot plate.

13. The ion implantation system of claim 10, wherein the lifting mechanism comprises one or more supports configured to selectively engage a periphery of the workpiece.

14. The ion implantation system of claim 1, wherein the pre-heat apparatus comprises a hot plate having gas cooling channels defined therein, wherein a gas provided within the gas cooling channels selectively cools the hot plate.

15. The ion implantation system of claim 1, wherein the pre-heat apparatus comprises a generally hollow pan having a ceramic lid, wherein an Inconel alloy heating element residing within the pan is configured to selectively provide radiant energy to the ceramic lid, and wherein the workpiece is selectively heated when residing on a surface of the ceramic lid.

16. The ion implantation system of claim 15, wherein the ceramic lid is comprised of silicon carbide.

17. The ion implantation system of claim 1, wherein the pre-heat apparatus comprises a radiant heat source.

18. The ion implantation system of claim 17, wherein the radiant heat source comprises one or more a halogen lamp, light emitting diode, and infra red thermal device.

19. The ion implantation system of claim 17, wherein the first chamber of one or more of the first dual load lock assembly and second dual load lock assembly comprises a window, wherein the radiant heat source is disposed outside of the first chamber and wherein radiant heat source is configured to direct radiant energy through the window toward the workpiece disposed within the first chamber.

20. The ion implantation system of claim 1, wherein the post-cool apparatus comprises a chilled workpiece support configured to actively cool a workpiece residing thereon via thermal conduction.

21. The ion implantation system of claim 1, wherein the chilled workpiece support comprises a cold plate having a second cooling channel passing therethrough, wherein a second cooling fluid passing through the second cooling channel substantially cools the workpiece residing on a surface of the cold plate.

22. The ion implantation system of claim 1, wherein the first and second chambers of each respective first dual load lock assembly and second dual load lock assembly are vertically stacked.

23. The ion implantation system of claim 1, wherein the thermal chuck comprises a ceramic heating element.

24. A dual load lock assembly for use in transitioning a workpiece from an atmospheric environment to a vacuum environment, comprising:
 a first chamber and a second chamber, wherein respective internal volumes of each first and second chamber are generally isolated from one another and share a common wall therebetween;
 a vacuum door associated with each first chamber and second chamber, wherein each vacuum door is configured to provide selective fluid communication between each respective first chamber or second chamber and the vacuum environment;
 an atmospheric door associated with each first chamber and second chamber, wherein each atmospheric door is configured to provide selective fluid communication between each respective first chamber or second chamber and an atmospheric environment, the atmospheric environment having an atmospheric pressure associated therewith;
 a heating apparatus associated with the first chamber, wherein the heating apparatus is configured to heat the workpiece disposed within the first chamber to a first temperature;
 a cooling apparatus associated with the second chamber, wherein the cooling apparatus is configured to cool the workpiece disposed within the second chamber to a second temperature; and
 a controller configured to activate the heating apparatus at the atmospheric pressure to transmit heat energy to the workpiece disposed in the first chamber, thereby heating the workpiece to the first temperature at the atmospheric pressure, and to activate the cooling apparatus to cool the workpiece to a second temperature.

25. A method for high temperature ion implantation of a workpiece in a ion implantation system having a first load lock chamber for transitioning a workpiece from an atmospheric environment to a vacuum environment and a second load lock chamber for transitioning a workpiece from the vacuum environment to the atmospheric environment, the method comprising:
 heating the workpiece at an atmospheric pressure associated with the atmospheric environment while the workpiece is disposed in the first load lock chamber; and
 cooling the workpiece at a vacuum pressure associated with the vacuum environment while the workpiece is disposed in the second load lock chamber.

26. The method of claim 25, wherein the vacuum pressure is a variable pressure associated with a transition from the vacuum pressure to the atmospheric pressure.

27. The method of claim 25, further comprising processing the workpiece at a process temperature, and wherein the workpiece is heated to a first temperature in the first load lock chamber.

28. The method of claim 27, wherein the first temperature is less than the process temperature.

29. The method of claim 27, wherein the first temperature is greater than the process temperature, and wherein the workpiece is permitted to cool to approximately the process temperature prior to processing the workpiece.

* * * * *